United States Patent [19]
Hiratsuka

[11] Patent Number: 6,119,245
[45] Date of Patent: Sep. 12, 2000

[54] SEMICONDUCTOR STORAGE DEVICE AND METHOD OF CONTROLLING IT

[75] Inventor: Shinji Hiratsuka, Tokyo, Japan

[73] Assignee: Oki Electric Industry Co., Ltd., Tokyo, Japan

[21] Appl. No.: 09/028,130

[22] Filed: Feb. 23, 1998

[30] Foreign Application Priority Data

Aug. 6, 1997 [JP] Japan ..................................... 9-211726

[51] Int. Cl.$^7$ .................................................. G11C 16/06
[52] U.S. Cl. ....................... 714/7; 714/6; 714/8; 365/200; 365/201; 365/185.09
[58] Field of Search ........................ 714/6, 7, 8; 365/200, 365/201, 185.09; 711/154, 170

[56] References Cited

U.S. PATENT DOCUMENTS

| | | | |
|---|---|---|---|
| 5,297,148 | 3/1994 | Harari et al. ........................... | 371/10.2 |
| 5,867,642 | 2/1999 | Vivo et al. .................................. | 714/6 |
| 6,031,758 | 2/2000 | Katayama et al. .................. | 365/185.09 |

Primary Examiner—Robert W. Beausoliel, Jr.
Assistant Examiner—James G. Weir
Attorney, Agent, or Firm—Jones Volentine, LLP

[57] ABSTRACT

The aim is to improve reliability and life of a semiconductor storage device using memory elements for which deterioration is a problem. In a semiconductor disk device equipped with a flash memory section 110 having memory elements M(0)~M(9) having a plurality of sectors used as ordinary sectors or spare sectors, and a disk controller section 120 that performs data writing/reading in respect of memory elements M(0)~M(9) in accordance with address information input from outside, there are provided a data error information management table 127 that stores for each memory element the situation regarding occurrence of write/read error of memory elements M(0)~M(9), a micro CPU 131 that detects deterioration of memory elements in accordance with the situation regarding occurrence of write/read error stored in data error information management table 127, and an address conversion table 128 that effects conversion of address information such that memory elements M(0)~M(9) for which deterioration has been detected by micro CPU 131 are not used.

20 Claims, 18 Drawing Sheets

FIG.2

| Physical Memory Number | Sector Number | Number Of Times Of Occurrence Of COR | Number Of Times Of Occurrence Of UNC |
|---|---|---|---|
| 0 | 0<br>1<br>2<br>⋮<br>m+n+2 | 0<br>0<br>1<br>⋮<br>0 | 0<br>0<br>0<br>⋮<br>0 |
| 1 | 0<br>1<br>2<br>⋮<br>m+n+2 | 110<br>119<br>104<br>⋮<br>107 | 0<br>0<br>0<br>⋮<br>0 |
| ⋮ | ⋮ | ⋮ | ⋮ |
| 8 | 0<br>1<br>2<br>⋮<br>m+n+2 | 0<br>0<br>0<br>⋮<br>0 | 0<br>0<br>0<br>⋮<br>0 |
| 9 | 0<br>1<br>2<br>⋮<br>m+n+2 | 0<br>0<br>0<br>⋮<br>0 | 0<br>0<br>0<br>⋮<br>0 |

FIG.3

| Physical Memory Number | Logical Memory Number |
|---|---|
| 0 | 0 |
| 1 | 1 |
| ⋮ | ⋮ |
| k−1 | k−1 |
| k | (Unused) |
| k+1 | k |
| k+2 | k+1 |
| ⋮ | ⋮ |
| 8 | 7 |
| 9 | 8 |

FIG.5

| Physical Memory Number | Sector Number | Number Of Times Of Writing | Number Of Times Of Reading | Number Of Times Of Occurrence Of COR | Number Of Times Of Occurrence Of UNC |
|---|---|---|---|---|---|
| 0 | 0<br>1<br>2<br>⋯<br>m | a<br>a<br>c<br>⋯<br>a | b<br>b<br>b<br>⋯<br>d | 0<br>0<br>1<br>⋯<br>0 | 0<br>0<br>0<br>⋯<br>0 |
| 1 | 0<br>1<br>2<br>⋯<br>m | b<br>c<br>c<br>⋯<br>a | b<br>b<br>b<br>⋯<br>d | 110<br>119<br>103<br>⋯<br>107 | 0<br>0<br>0<br>⋯<br>0 |
| ⋯ | ⋯ | ⋯ | ⋯ | ⋯ | ⋯ |
| 9 | 0<br>1<br>2<br>⋯<br>m | a<br>b<br>c<br>⋯<br>d | e<br>b<br>b<br>⋯<br>c | 0<br>0<br>0<br>⋯<br>0 | 0<br>0<br>0<br>⋯<br>0 |

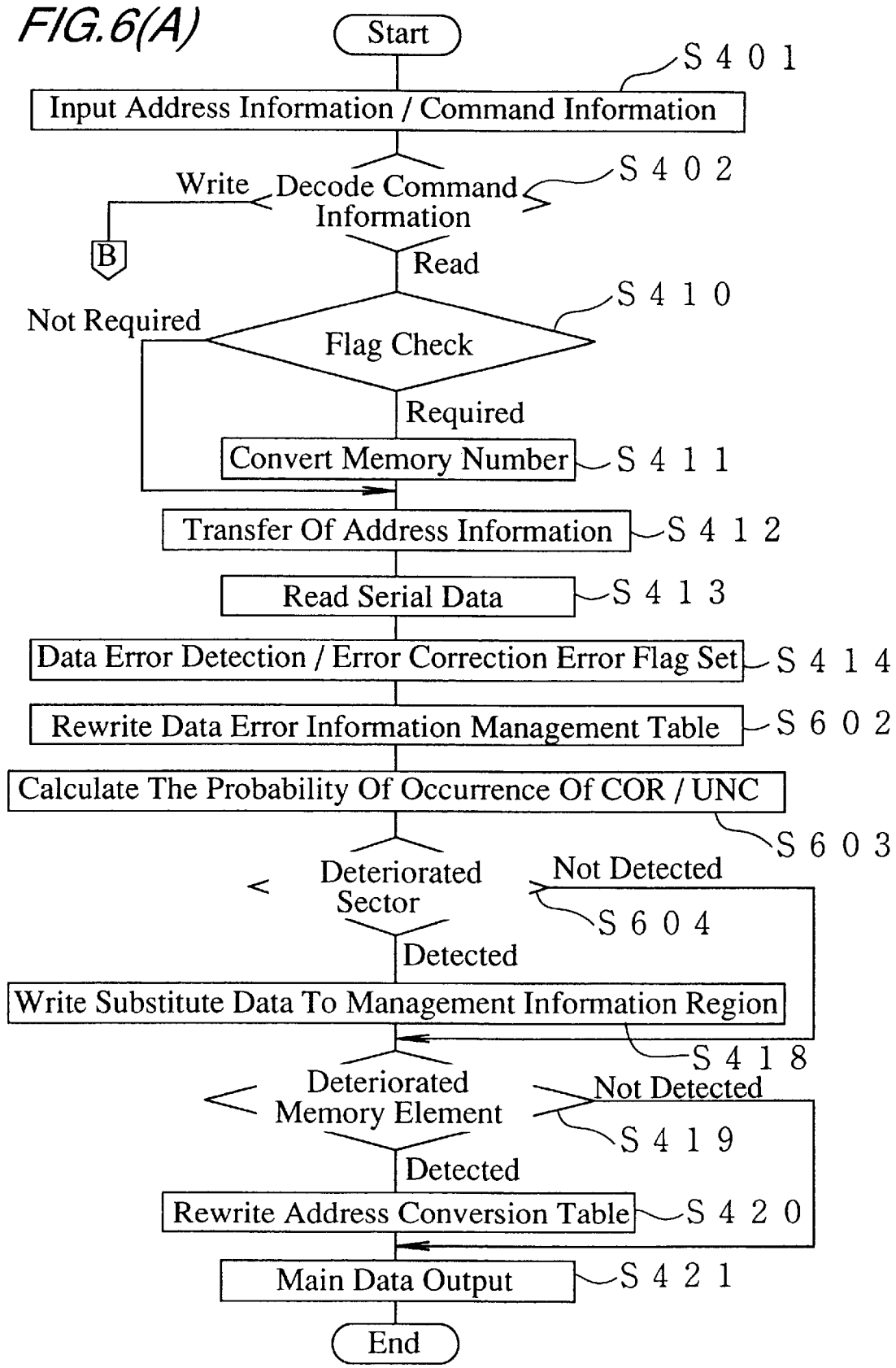

FIG. 7

| Memory Number | Sector Number | Number Of Times Of Writing | Number Of Times Of Reading | Number Of Times Of Occurrence Of COR | | | | Number Of Times Of Occurrence Of UNC | | | |
|---|---|---|---|---|---|---|---|---|---|---|---|
| | | | | $C_1$ | $C_2$ | ... | $C_h$ | $U_1$ | $U_2$ | ... | $U_h$ |
| 0 | 0 | a | b | | | | | | | | |
| | 1 | a | b | 21 | | | | | | | |
| | 2 | c | b | 28 | 25 | | 13 | 51 | | | |
| | ... | ... | ... | | | | | | | | |
| | m | a | d | | | | | | | | |
| 1 | 0 | b | b | 37 | 25 | | 13 | 21 | | | |
| | 1 | c | b | 18 | 17 | | | | | | |
| | 2 | c | b | | | | | 18 | | | |
| | ... | ... | ... | | | | | | | | |
| | m | a | d | | | | | | | | |
| ... | ... | ... | ... | | | | | | | | |
| 9 | 0 | a | e | | | | | | | | |
| | 1 | b | b | | | | | 14 | | | |
| | 2 | c | b | | | | | | | | |
| | ... | ... | ... | | | | | | | | |
| | m | d | c | 26 | | | | | | | |

During Ordinary Operation     During Degeneracy Operation

FIG.10

| Physical Memory Number | Logical Memory Number |
|---|---|
| 0 | 0 |
| 1 | 1 |
| ⋮ | ⋮ |
| j − 1 | j − 1 |
| j | Not Used |
| j + 1 | j + 1 |
| j + 2 | j + 2 |
| ⋮ | ⋮ |
| 8 | 8 |
| 9 | 9 |

| Sector Number In PhysicalMemory Number m | Logical Memory Number | Number Of Sector |
|---|---|---|
| 0 | 0 | x |
| 1 | | x + 1 |
| ⋮ | | ⋮ |
| g | | x + g |
| g + 1 | 1 | x |
| ⋮ | | ⋮ |
| 2 g | | x + g |
| ⋮ | | |
| 8 g + 1 | 8 | x |
| ⋮ | | ⋮ |
| 9 g | | x + g |
| 9 g + 1 | 9 | x |
| ⋮ | | ⋮ |
| 1 0 g | | x + g |

| Address (4 Bits) | Command (8 Bits) | Main Data (512Bytes) | ECC Data (11Bytes) |
|---|---|---|---|

SEMICONDUCTOR STORAGE DEVICE AND METHOD OF CONTROLLING IT

BACKGROUND OF THE INVENTION

1. Field of the Invention

The present invention relates to a semiconductor storage device such as a semiconductor disk device in which for example flash memory elements are installed and to a method of controlling this; in more detail, it relates to a semiconductor storage device and method of controlling it wherein degeneracy operation is performed if a memory element deteriorates.

2. Description of the Related Art

Conventionally, as semiconductor devices, semiconductor disk devices are known using for example flash memory. In such flash memory elements used in semiconductor disk devices, the bits may deteriorate with repeated reading and writing. When a bit has deteriorated in a flash memory element, reading and writing subsequent to that bit becomes impossible. As a result, a data error (i.e. the situation that write data and read data do not coincide) occurs on reading.

To deal with this, there is already known a technique called ECC (Error Correction Code) control; this constitutes a control technique whereby it is possible to detect whether or not data read from flash memory elements is correct. With this technique, it is possible to detect the occurrence of a data error when data is read from flash memory elements; furthermore, when a data error is detected, it is possible to determine whether this is a COR (Correctable Error i.e. a data error that can be corrected) or a UNC (Uncorrectable Error, i.e. a data error that cannot be corrected). And if the detected data error is a COR, this read data can be corrected.

In a conventional semiconductor disk device, when deterioration of a bit of a flash memory element was detected by ECC control, the sector to which this bit belonged was designated as "use forbidden", and it was arranged to employ an alternative sector provided beforehand in substitution for such a sector (hereinbelow called "deteriorated sector").

FIG. 12 is a block diagram showing conceptually an example of the layout of a conventional semiconductor disk device. Also, FIG. 13 is a flow chart given in explanation of the operation of such a semiconductor disk device.

Command information and address information that is input to disk controller 1220 from outside semiconductor disk device 1200 is sent, through host interface 1221 and micro CPU interface 1222, to a micro CPU (Central Processing Unit) 1231 within microcontroller section 1230 (S1301).

At this point, if this command information is a write command (S1302), micro CPU 1231 inputs main data that was input from outside to data buffer 1223 (S1303) through host interface 1221. Then, command information and address information from micro CPU 1231 and main data from data buffer 1223 are respectively sent to flash memory interface 1225 (S1304). Then, ECC control section 1226 generates ECC data by inputting main data from flash memory interface 1225 and sends this ECC data to flash memory interface 1225 (S1305). Serial data are then compiled (S1306) within this flash memory interface 1225.

FIG. 14 is a diagram showing the structure of serial data compiled within flash memory interface 1225. As shown in this Figure, this serial data consists for example of four bits of address information, for example eight bits of command information, for example 512 bytes of main data, and for example 11 bytes of ECC data.

Such serial data is output from flash memory interface 1225 and is input respectively in parallel to ten memory elements M(0)~M(9) within flash memory section 1210. If the address information in this serial data corresponds to a sector within their own storage region, these memory elements M(0)~M(9) write serial data to that sector (S1307).

FIG. 15 is a diagram showing the sector arrangement within memory elements M(0)~M(9). As shown in this Figure, each memory element M(0)~M(9) comprises m+1 sectors S(0)~S(m). Thus, of the sectors S(0)~S(m), the serial data referred to above is stored in the sector designated by the address information.

On the other hand, in step S1302, if the command information that is fetched into micro CPU 1231 is a read command, this micro CPU 1231 transfers address information to flash memory interface 1225 (S1308). Then, flash memory interface 1225 reads the serial data (S1309) stored in the sector corresponding to this address. ECC control section 1226 then reads the main data and ECC data in this serial data from flash memory interface 1225 and detects whether or not a data error has occurred (S1310). Then, if it detects that the COR type of data error has occurred, it corrects this error and sends this to flash memory interface 1225 (S1310). In contrast, if UNC is detected, micro CPU 1231 sets a flag (hereinbelow called "error flag") to indicate that the data is UNC. After this, under the control of data transfer control section 1224, data within flash memory interface 1225 (if COR has occurred, corrected data) is output to the outside of semiconductor disk device 1200 through data buffer 1223 and host interface 1221 (S1311).

Also, this semiconductor disk device 1200 deems a sector from which a data error (COR or UNC) has been detected more than a prescribed number of times to be a deteriorated sector. Then, in subsequent writing, instead of this deteriorated sector, it employs one or other of substitute sectors D(0)~D(n) (see FIG. 15). When this happens, when use of a substitute sector D(0)~D(m) has been decided upon, in a management information region 1501 (see FIG. 15), the address information of the substitute sector that is to be used in place of this deteriorated sector is stored (S1312) together with the address information of the deteriorated sector. By this means, if, in subsequent write processing, the address information that is input from outside to disk controller 1220 is the address of a deteriorated sector, serial data is written to the substitute sector corresponding to this deteriorated sector.

Thus, in a conventional semiconductor disk device 1200, reliability of the device was sought to be maintained by employing a substitute sector in place of a deteriorated sector if a deteriorated sector was generated.

However, in such a semiconductor disk device 1200, as described above, uncorrectable data errors (i.e. UNC) can occur, so, in cases where a large number of sectors in a single memory element deteriorate practically simultaneously, a large amount of data errors are generated simultaneously, resulting in data loss. This resulted in the drawback of the device reliability of a conventional semiconductor disk device 1200 being insufficient.

Also, in such a semiconductor disk device 1200, if the number of deteriorated sectors in any one memory element exceeded the number of substitute sectors, it became impossible to effect substitution in respect of a deteriorated sector; because of this, the entire element became unusable. Such a memory element was therefore subject to the drawback that the life of the element as a whole became very short, since even sectors that had not deteriorated became unusable.

Although the present description takes by way of example the case of a semiconductor disk device incorporating flash memory elements, such drawbacks can occur even in memory devices incorporating other types of memory elements, so long as these are subject to deterioration.

SUMMARY OF THE INVENTION

In a semiconductor storage device that uses memory elements in which deterioration is a problem, an object of the present invention is to improve the reliability of this storage device and to prolong its life.

According to the present invention, the above object is achieved by means of the following construction:

(1) A semiconductor storage device according to a first aspect of the invention comprises: a storage section comprising a plurality of memory elements having a plurality of sectors that are used as ordinary sectors or spare sectors; a control section that performs writing/reading of data to the memory elements in accordance with address information input from outside; a data error information management table that stores the situation regarding occurrence of write/read errors of the memory elements; a deterioration detection section that detects the deterioration of the memory elements in accordance with the write/read error occurrence situation stored in this data error information management table; and an address conversion table that converts the address information such that a memory element that is detected to have deteriorated by this deterioration detection section is not used.

With such a construction, the deterioration situation of each memory element can be accurately determined in accordance with the situation regarding occurrence of write/read errors stored in the error information management table and it can be arranged not to employ memory elements that show severe deterioration; the reliability of the semiconductor storage device can thereby be improved.

Also, according to this first aspect of the present invention, since the address information is converted by means of the address conversion table, if it is arranged to employ spare sectors within another memory element in place of respective sectors within a deteriorated memory element, lowering of storage capacity when a deteriorated element is generated can be prevented, so the life of the semiconductor storage device can be lengthened.

(2) A method of controlling a semiconductor storage device according to a second aspect of the present invention comprises the steps of: storing the situation regarding occurrence of write/read errors of a plurality of memory elements having a plurality of sectors employed as ordinary sectors or as spare sectors in a data error information management table; detecting deterioration of the memory elements by a deterioration detection section in accordance with the situation regarding occurrence of write/read errors stored in the data error information management table in this storage step; and converting the address information by an address conversion table such that memory elements in respect of which deterioration has been detected by the deterioration detection section in this detection step are not used.

With such a method of control, deterioration of a memory element can be detected in the detection step in accordance with the situation regarding occurrence of write/read errors stored in the error information management table in the storage step and, further, it can be arranged not to employ memory elements that show severe deterioration; the reliability of the semiconductor storage device can thereby be improved.

Also, according to this second aspect of the present invention, since the address information is converted by means of the address conversion table, if it is arranged to employ spare sectors within another memory element in place of respective sectors within a deteriorated memory element, lowering of storage capacity when a deteriorated element is generated can be prevented, so the life of the semiconductor storage device can be lengthened.

BRIEF DESCRIPTION OF THE DRAWINGS

Other objects and advantages of the present invention are described below with reference to the appended drawings.

FIG. 2 is a diagram showing the layout of a data error information management table according to a first embodiment;

FIG. 3 is a diagram showing the layout of an address conversion table according to a first embodiment;

FIG. 5 is a diagram showing the layout of a data error information management table according to a second embodiment;

FIG. 7 is a diagram showing the layout of a data error information management table according to a third embodiment;

FIG. 10 is a diagram given in explanation of the principles of address conversion according to a fourth embodiment;

DESCRIPTION OF THE PREFERRED EMBODIMENTS

Figure 1:
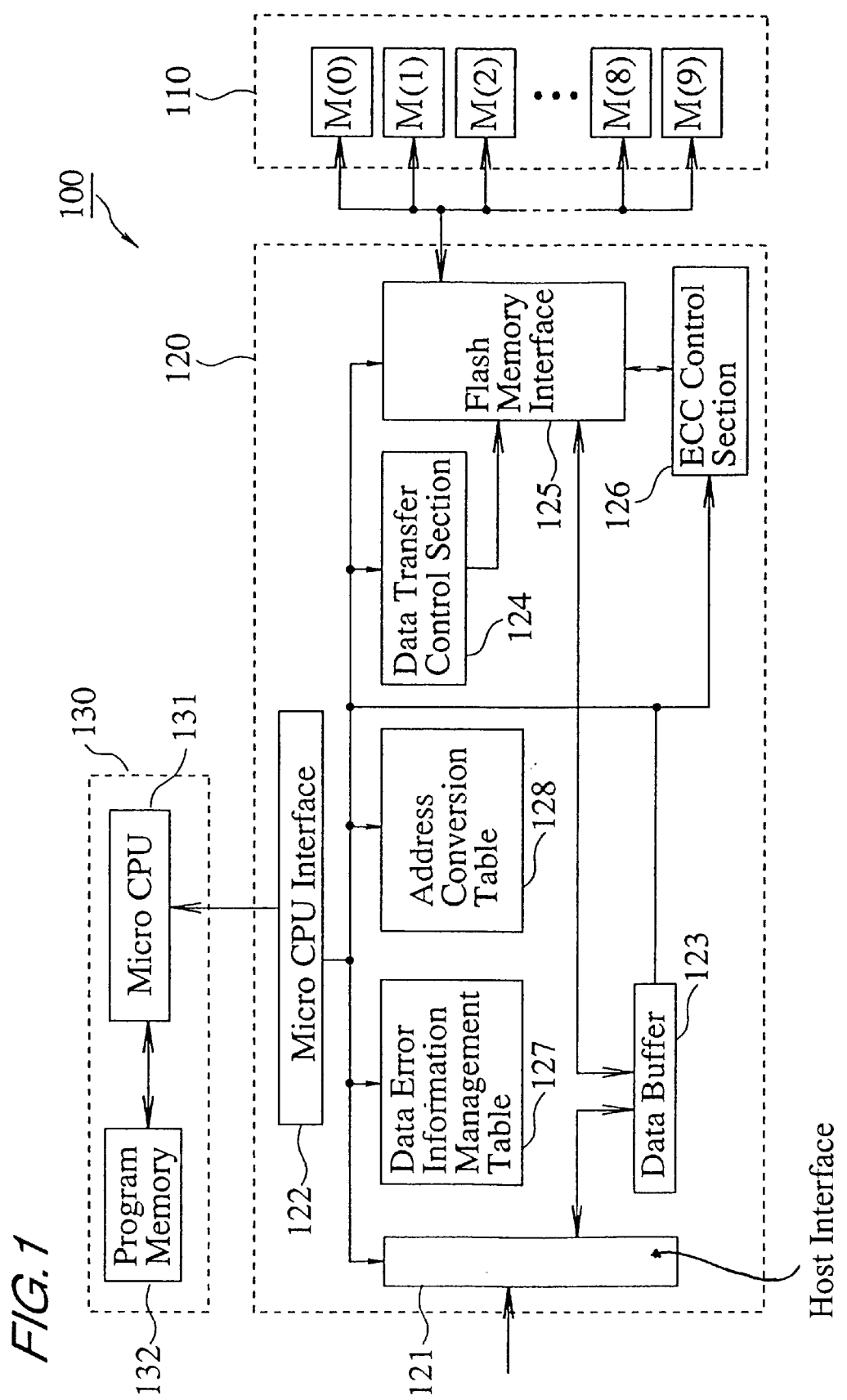
FIG. 1 is a block diagram showing schematically the layout of a semiconductor storage device according to a first embodiment.

Embodiments of the present invention are described below using the drawings. It should be noted that the sizes, shapes and arrangement relationships of the various structural constituents in the drawings are only shown diagrammatically to the extent necessary to permit understanding of the present invention; it is also to be understood that the numerical conditions described below are given merely by way of example.

First Embodiment

First of all, a semiconductor storage device and a method of controlling it according to a first embodiment of the present invention are described, taking as example a semiconductor disk device using flash memory.

FIG. 1 is a block diagram showing schematically the layout of a semiconductor disk device according to this embodiment.

As shown in this Figure, this semiconductor disk device 100 comprises a flash memory section 110, disk controller section 120 and microcontroller section 130.

Figures 14, 15:
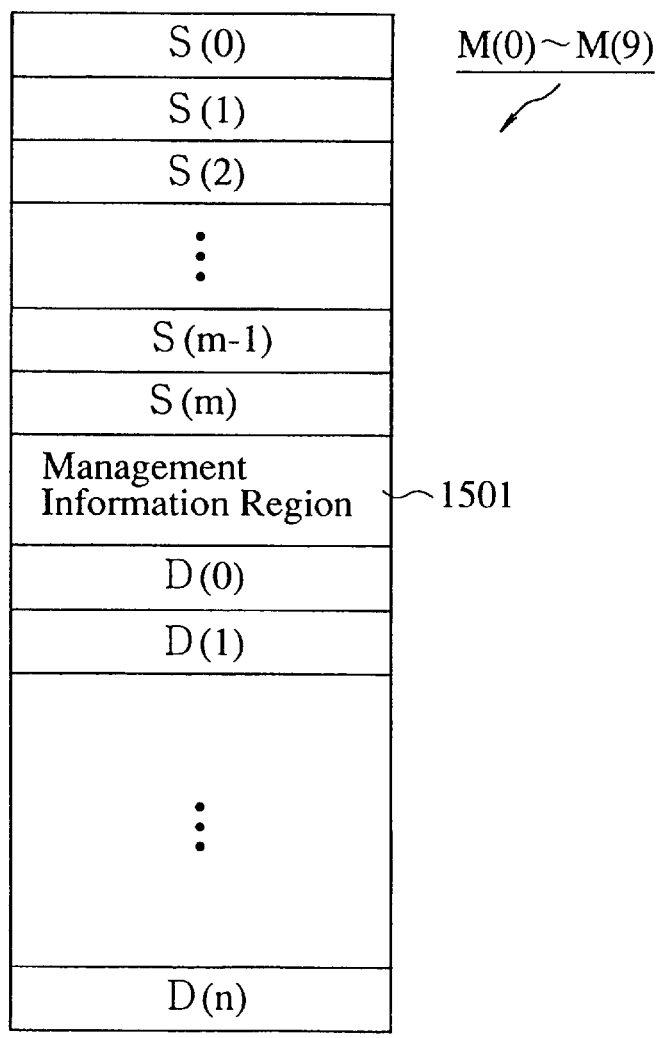
FIG. 14 is a diagram showing the layout of serial data compiled within a flash memory interface in a prior art semiconductor storage device.
FIG. 15 is a diagram showing the sector layout within memory elements provided in a flash memory section of a prior art semiconductor storage device.

Flash memory section 110 comprises ten memory elements M(0)~M(9). These memory elements M(0)~M(9) exchange serial data with a flash memory interface 125 (to be described) respectively in accordance with the timing of a system clock signal (not shown) that is input from outside. The sector structure of memory elements M(0)~M(9) is the same as in the prior art case (see FIG. 15) so description thereof is omitted.

In disk controller section 120, host interface 121 is an interface for transferring address information and/or command information or main data etc. with the outside of semiconductor disk device 100. Also, micro CPU interface 122 is an interface for transferring address information and/or command information or control signals etc. with respect to disk controller section 120 and microcontroller section 130 (to be described).

Data buffer 123 is a buffer for transferring main data etc. with respect to flash memory interface 125 and host interface 121.

Data transfer control section 124 controls operation of this flash memory interface 125 when flash memory interface 125 performs data transfer with the outside through data buffer 123 and host interface 121.

Flash memory interface 125, when data is written, uses the address information, command information, main data and ECC data to compile serial data, which it then sends to flash memory section 110. Also, on data reading, it performs an action of inputting serial data from flash memory section 110, extracting main data and ECC data and sending these to ECC control section 126 (to be described), and/or an action of outputting such main data (or main data input after correction from ECC control section 126) to data buffer 123. The structure of the serial data is the same as conventionally (see FIG. 14), so a description thereof is omitted.

ECC control section 126, on data writing, fetches write data from flash memory interface 125 and compiles ECC data, which it then sends to flash memory interface 125. Also, when data is read, it performs an operation of inputting main data and ECC data from flash memory interface 125 and detecting whether or not a data error has been generated and/or an operation of correcting main data if generation of a COR is detected.

Data error information management table 127 stores for each sector of memory elements M(0)~M(9) the number of times of occurrence of data errors, broken down between COR and UNC.

FIG. 2 is a diagram showing the layout of data error information management table 127. In this Figure, physical memory numbers "0", "1", . . . "9" are respectively allocated to memory elements M(0), M(1), . . . , M(9). Also, sector numbers are respectively allocated to the m+1 sectors S(0)~S(m) provided in memory elements M(0)~M(9) and the n+1 substitute sectors D(0)~D(n) (see FIG. 15) provided in them. Then, for each of these sectors, the number of times of occurrence of COR and the number of times of occurrence of UNC are stored. Rewriting of the number of times of occurrence of COR and the number of times of occurrence of UNC is performed by micro CPU 131 (to be described).

Furthermore, in FIG. 1, if any one or more of memory elements M(0)~M(9) are unused (to be described), address conversion table 128 converts the memory number in the address information from a physical memory number to a logical memory number.

FIG. 3 is a diagram showing the layout of such an address conversion table 128. As shown in this Figure, when any of memory elements M(0)~M(9) become unused, this address conversion table 128 is employed: for example, if the memory element of physical memory number k becomes unused (the number of memory elements that can be used in this case is 9) logical memory numbers 0~8 are successively written (see FIG. 3) allocated to the other respective memory elements (physical numbers 0~k−1, k+1~9). Memory numbers in address information that is input from the external host computer (not shown) are thus converted into physical memory numbers and output. Also, if the number of unused memory elements is increased, the logical memory numbers are further rewritten. Determination of whether or not address conversion is to be performed and rewriting of logical memory numbers are performed by micro CPU 131 (to be described).

Micro CPU 131 in microcontroller section 130 shown in FIG. 1 controls flash memory section 110 and disk controller section 120 in accordance with the command information and/or address information etc. that is input from outside through host interface 121 and micro CPU interface 122.

A program memory 132 stores a program for operating micro CPU 131. Also, in this program memory 132, there are provided a degeneracy operation required/not required flag (not shown) constituting a flag for setting whether or not address conversion processing using address conversion table 128 is to be performed and an error flag indicating whether the output data is normal data or error data.

Figure 4A:
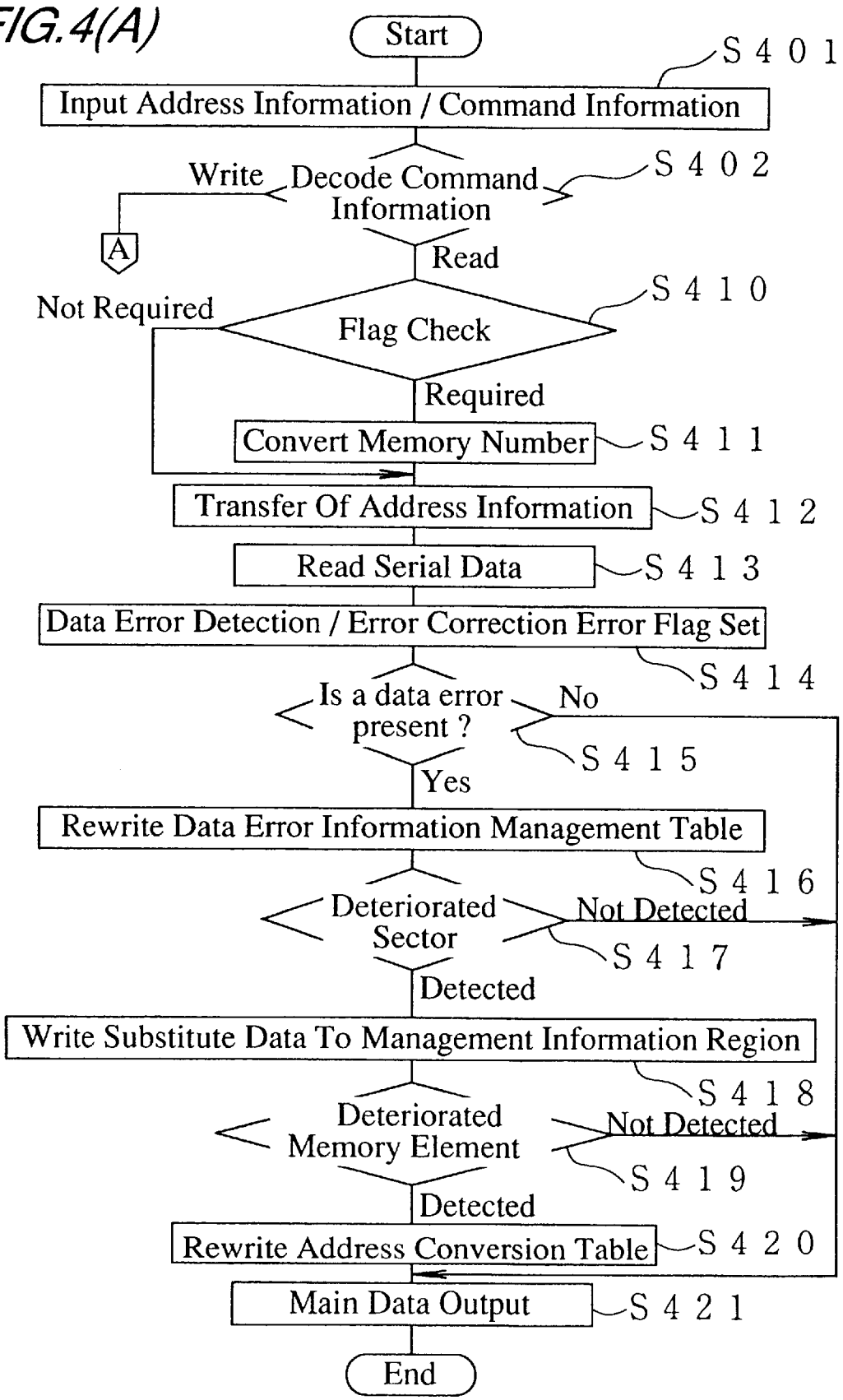
FIGS. 4(A and B) is a flow chart given in explanation of the operation of a semiconductor storage device according to a first embodiment.
Figure 4B:
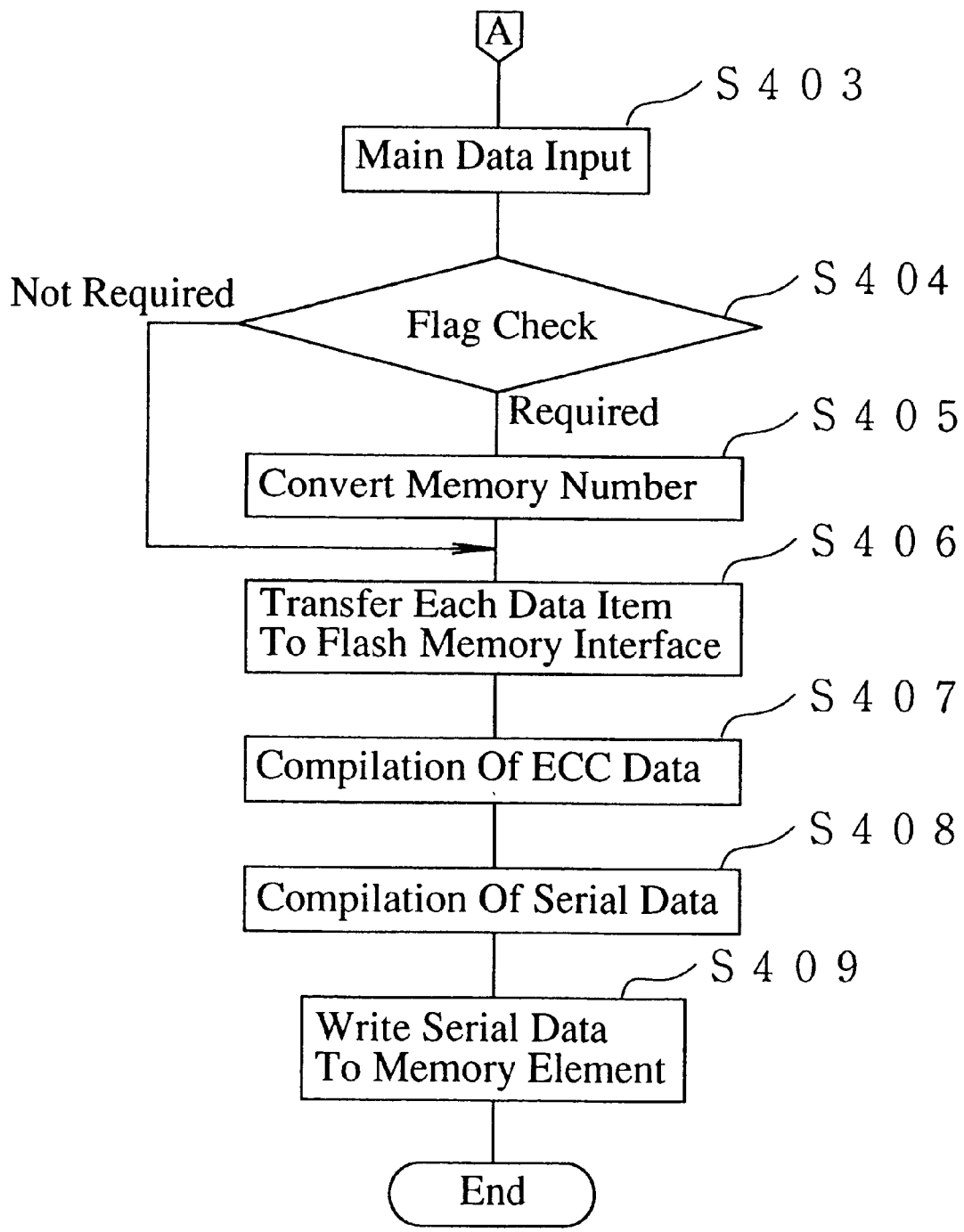

Next, the operation of a semiconductor disk device 100 according to this embodiment will be described using the flow chart of FIG. 4.

First of all, command information and address information are input from outside semiconductor disk device 100 through host interface 121 in the same way as conventionally. These items of information are sent to micro CPU 131 (S401) in microcontroller section 130 through micro CPU interface 122.

Next, micro CPU 131 decodes (S402) the content of the command information. Then, if this command information is a write command, main data is input from outside (S403). This main data is input to data buffer 123 through host interface 121.

Next, micro CPU 131 checks the condition of the degeneracy operation required/not required flag (S404). Then, if the degeneracy operation required/not required flag is "required", it sends the physical memory number extracted from the address information to address conversion table 128, and gets the converted memory number (i.e. the logical memory number) from this address conversion table 128 (S405). In contrast, if this degeneracy operation required/not required flag is "not required", it sends the address information, command information and main data to the flash memory interface (S406) without performing address information conversion.

ECC control section 126 compiles the ECC data by getting the main data from flash memory interface 125 and sends this to flash memory interface 125 (S407). Serial data (see FIG. 14) are then compiled within this flash memory interface 125 in the same way as conventionally (S408).

These serial data are respectively input in parallel from flash memory interface 125 to the ten memory elements M(0)~M(9) within flash memory section 110. Each memory element M(0)~M(9), if the memory number in the address information contained in the serial data coincides with its own memory number, accepts this serial data. This serial data is then written (S409) into the sector designated by the address information of the serial data. Thereupon, in the memory elements M(0)~M(9) according to this embodiment, just as in the case of the prior art memory elements (see FIG. 15), if the sector corresponding to address information is deteriorated, the serial data is written to one or other of substitute sectors D(0)~D(n), in accordance with the content of the management information region 1501.

In contrast, in step S402, if the command information is a read command, micro CPU 131 checks (S410) the condition of the degeneracy operation required/not required flag. Then, if this degeneracy operation required/not required flag is "not required", it sends the address information to the flash memory interface 125 without modification (S412). On the other hand, if the degeneracy operation required/not required flag is "required", it sends the physical memory number contained in the address information to address conversion table 128 and receives a converted memory number (i.e. logical memory number) from this address conversion table 128; it thereupon sends (S412) address information containing this logical memory number together with command information to the flash memory interface 125.

This flash memory interface 125 reads the serial data stored in the sector corresponding to this address (S413). At this point also, just as in the case of the write operation described above, if any of the substitute sectors D(0)~D(9) is in use, reading from this substitute sector is performed, as specified by the content of management information region 1501.

Next, ECC control section 126 checks to see whether or not a data error has been generated (S414) by reading the main data in this serial data and the ECC data from the flash memory interface 125. Then, if a data error COR is detected, this error is corrected, and the result is sent to flash memory interface 125 (S414). On the other hand, if ECC control section 126 detects UNC, micro CPU 131 sets the error flag indicating that the data is UNC (S414).

Next, a determination is made (S415) as to whether a data error was detected or not in the error check described above (S414). If a data error was detected, the data error information management table 127 is then rewritten (S416). This rewriting of data error information management table 127 is performed by adding "1" to the number of times of generation of COR or number of times of generation of UNC of each sector in which an error was generated.

Next, micro CPU 131 compares the number of times of generation of COR and the number of times of generation of UNC of each sector with a prescribed value (hereinbelow called "threshold value of number of times of data error generation"), using this data error information management table 127. It then designates any sector for which at least one of the number of times of generation of COR or number of times of generation of UNC has exceeded the threshold value for the number of times of data error generation as being a deteriorated sector (S417). If a deteriorated sector is detected, in the same way as in the prior art case, information for using a substitute sector on subsequent write operations is stored in management information region 1501 (see FIG. 15) (S418). Further, if a new deteriorated sector is detected in this way, micro CPU 131 adds up, for the memory element to which these deteriorated sectors belong, the total number of deteriorated sectors, and compares this total value with a prescribed threshold value (hereinbelow called "number of sectors threshold value"). If then the total number of deteriorated sectors exceeds the number of sectors threshold value, this memory element is deemed to be deteriorated (S419). Further, if a new deteriorated memory element is detected in this way, micro CPU 131, as described above, rewrites the logical memory number of address conversion table 128 (S420).

After this, under the control of data transfer control section 124, the data in flash memory interface 125 (if correction was performed by the ECC, corrected data) is output to outside the semiconductor disk device 100 through data buffer 123 and host interface 121 (S421).

It should be noted that even if UNC was detected by ECC control section 126, error data is still directly output. In this situation, the determination as to whether the output data is normal data or is error data is performed by reading the error flag of program memory 132 from outside.

As described above, with a semiconductor disk device 100 according to this embodiment, it is possible to determine accurately the extent to which deteriorated sectors have been generated, for each memory element M(0)~M(9), based on the extent of write/read error generation stored in data error information management table 127. Using address conversion table 128, use of a memory element for which the number of deteriorated sectors generated was large is then suspended. Large-scale loss of data due to malfunction of memory elements can therefore be prevented.

Also, since it is possible to anticipate at an early stage malfunction of the memory element as a whole or the likelihood of malfunction of the semiconductor disk device as a whole at an early stage, countermeasures such as taking backups of previously written data can be made possible. In this way, large-scale loss of data can be prevented.

It should be noted that, although in this embodiment, a sector was deemed to be deteriorated when at least one of the number of times of generation of COR or the number of times of generation of UNC exceeded the threshold for the number of times of generation of data error, it would be possible to adopt another method for this determination. For example, it would be possible to alter the threshold value for the number of times of data error generation with the number of times of COR generation and number of times of UNC generation, or it would be possible to deem a sector to be deteriorated when the sum of the number of times of generation of COR and the number of times of generation of UNC exceed the threshold value for the number of times of data error generation.

Second Embodiment

Next, a semiconductor storage device and method of controlling it according to a second embodiment of the present invention will be described, taking as example a semiconductor disk device using a flash memory.

The semiconductor disk device according to this embodiment differs from that of the first embodiment described above in that the determination as to whether a sector is deteriorated or not is made in accordance with the probability of COR generation and the probability of UNC generation.

Since the overall layout of semiconductor disk device 100 and the layout of address conversion table 128 are the same as in the first embodiment (see FIG. 1 and FIG. 3), description thereof is omitted.

FIG. 5 is a diagram showing the layout of a data error information management table 127 according to this embodiment. As shown in this Figure, data error information management table 127 according to this embodiment differs from the case of the first embodiment described above (see FIG. 2) in that, in addition to storing the number of times of generation of COR and the number of times of generation of UNC, it stores the number of times of writing and the number of times of reading.

Figure 6B:
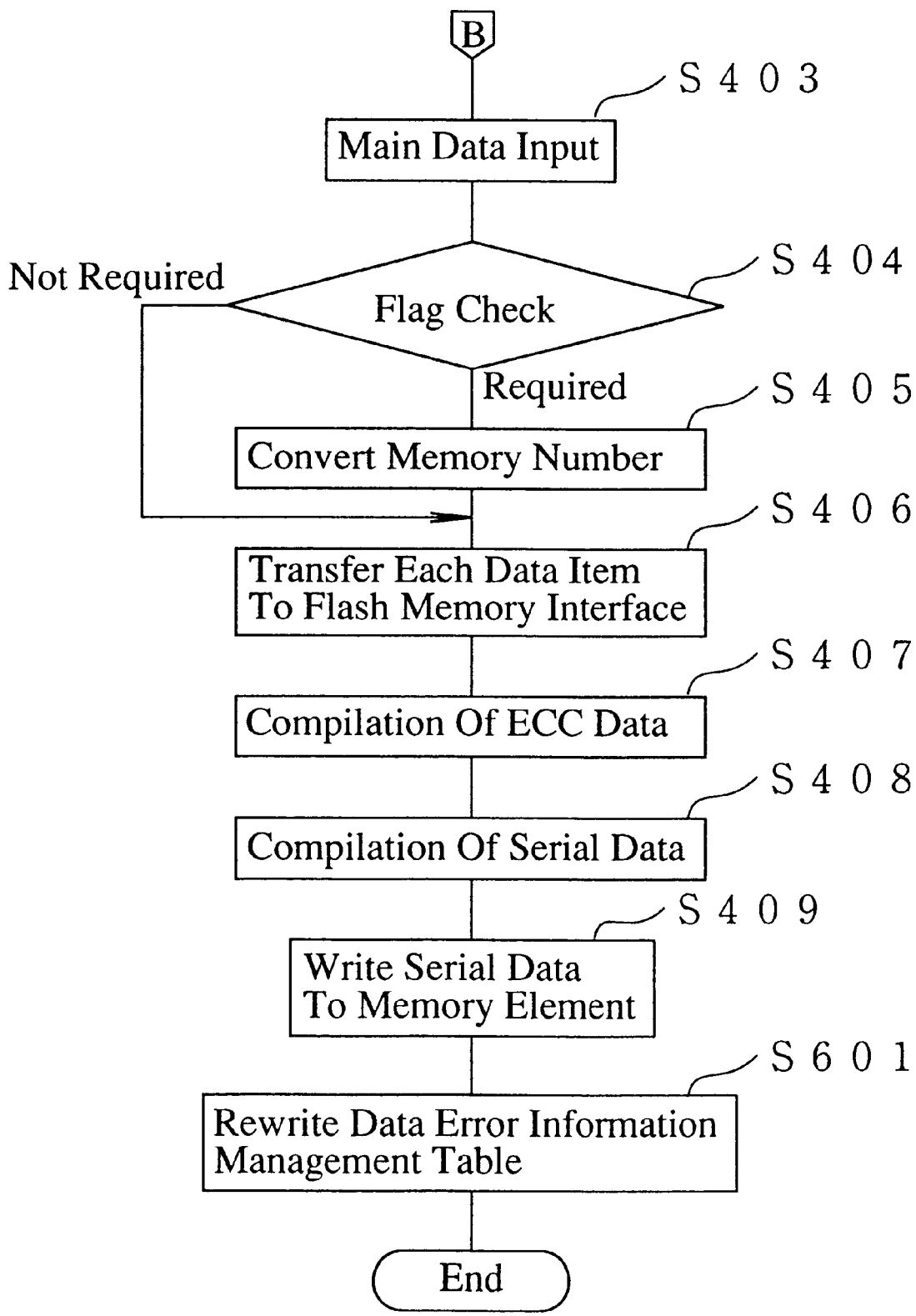
FIGS. 6(A and B) is a flow chart given in explanation of the operation of a semiconductor storage device according to a second embodiment.

FIG. 6 is a flow chart given in explanation of the operation of a semiconductor disk device 100 according to this embodiment.

First of all, just as in the case of the first embodiment (FIG. 4), micro CPU 131 inputs (S401) command information and address information through host interface 121 and micro CPU interface 122; this micro CPU 131 then decodes (S402) the content of the command information.

Then, if this command information is a write command, micro CPU 131, just as in the case of the first embodiment, performs input (S403) of main data and checking (S404) of the degeneracy operation required/not required flag; if the degeneracy operation required/not required flag is "required", using address conversion table 128, it converts the memory number to the physical memory number (S405), and then sends the address information, command information and main data to the flash memory interface (S406). Then, after ECC control section 126 has compiled ECC data (S407) using the main data, flash memory interface 125 compiles serial data (see FIG. 14) (S408), and writes this serial data into the sector corresponding to the address information mentioned above (if this sector is deteriorated, into a prescribed substitute sector) (S409).

At this point, in this embodiment, after writing of serial data has been completed, rewriting of data error information management table 127 is performed (S601). This is done by adding "1" to the "number of times of writing" of the sector in respect of which writing was performed.

If, on the other hand, in step S402, it is found that the command information is a read command, just as in the case of the first embodiment, micro CPU 131 checks the condition of the degeneracy operation required/not required flag (S410); if this is "required", the memory number is converted to a physical memory number (S411) and then the address information is sent to flash memory interface 125 (S412). Then, flash memory interface 125 reads serial data from the sector corresponding to the address information (if this sector is deteriorated, the prescribed substitute sector) (S413) and data error detection and correction are performed by ECC control section 126 and setting of the error flag is performed by micro CPU 131 (S414).

Continuing from this read operation, in this embodiment, the data error information management table 127 is rewritten (S602). In this rewriting, the "number of times of reading" of sectors that have been read are respectively incremented by "1" and the "number of times of generation of COR" or "number of times of generation of UNC" of sectors for which errors have been detected in the error check described above (S416) are incremented by "1".

Next, in this embodiment, micro CPU 131 calculates the probability of occurrence of COR and the probability of occurrence of UNC (S603) for each sector using the following expressions (1) and (2), using data error information management table 127.

Probability of occurrence of $$COR = \frac{\text{number of times of occurrence of } COR}{\text{number of times of reading} + \text{number of times of writing}} \quad (1)$$

Probability of occurrence of $$UNC = \frac{\text{number of times of occurrence of } UNC}{\text{number of times of reading} + \text{number of times of writing}} \quad (2)$$

The probability of occurrence of COR and the probability of occurrence of UNC of each sector are then compared with a prescribed threshold value (hereinbelow called "threshold value of the probability of occurrence of data error"). Sectors for which at least one of the probability of occurrence of COR or the probability of occurrence of UNC exceeds the data error occurrence probability threshold value are then deemed to be deteriorated (S604). If a deteriorated sector is detected, just as in the case of the first embodiment, information for the use of a substitute sector by subsequent write operations is stored in control information region 1501 (see FIG. 15) (S418); the total number of deteriorated sectors in the memory element to which this deteriorated sector belongs is added up and compared with the sector number threshold value; furthermore, if the total number of deteriorated sectors exceeds the sector number threshold value, the memory element is deemed to be deteriorated (S419) and the logical memory numbers in address conversion table 128 are rewritten (S420).

After this, just as in the case of the first embodiment, the data in flash memory interface 125 (if there is a correction by the ECC, the corrected data) are output to outside semiconductor disk device 100 (S421) through data buffer 123 and host interface 121.

Thus, in this embodiment, the determination as to whether a sector is deteriorated or not is performed with reference to the probability of occurrence of COR and the probability of occurrence of UNC. Consequently, since it is possible to determine whether or not deterioration has occurred even in the case of for example sectors that, while their number of occurrences of data errors is less than that of other sectors, have been written to or read from fewer times, the situation in regard to occurrence of deteriorated sectors can be determined more accurately.

Also, it is the same as the first embodiment described above in that, using address conversion table 128, it can be arranged not to employ memory elements having a high number of occurrence of deteriorated sectors and/or in that failure of the memory element as a whole or failure of the semiconductor disk device as a whole can be estimated at an early stage.

It should be noted that, although in this embodiment, the determination of sector deterioration was made on the basis of at least one of the number of occurrences of COR or the number of occurrences of UNC exceeding the data error occurrence probability threshold value, other methods of determination could be adopted. For example, the data error occurrence probability threshold value could be altered with the probability of COR occurrence and the probability of UNC occurrence, or the probability of occurrence of data error could be calculated without distinguishing COR and UNC.

Third Embodiment

Next, the present invention will be described taking as example a semiconductor disk device using a flash memory, with respect to a semiconductor storage device and method of manufacturing it according to a third embodiment of the present invention.

A semiconductor disk device according to this embodiment differs from the embodiments described above in that the determination as to whether or not a sector has deteriorated is performed with reference to the number of occurrences of error (COR or UNC) in each of a prescribed number of times of writing/reading (for example 10000 times).

It should be noted that the overall construction of semiconductor disk device 100 and the construction of address conversion table 128 are the same as in the case of the first embodiment (see FIG. 1 and FIG. 3), so description thereof is omitted.

FIG. 7 is a diagram showing the layout of a data error information management table 127 according to this embodiment. As shown in this Figure, data error information management table 127 according to this embodiment stores the number of times of writing and the number of times of reading and also stores the number of times when COR occurred and the number of times when UNC occurred. In this connection, the number of times when COR occurred means the number of times of occurrence of COR in each of a prescribed number of times of writing/reading (in this case, 10000 times). Specifically, the number of CORs that occurred when the total of the number of times of writing and the number of times of reading was from once~10000 times is stored in storage region $C_1$ in each sector. Also, the number of CORs occurring when the total of number of times of writing and number of times of reading is 1001 times~20000 times is stored in storage region $C_2$ for each sector. Likewise, the number of times when UNC occurred means the number of times of occurrence of UNC in each of a prescribed number of times of writing/reading and is respectively stored in storage regions $U_1$~$U_h$ for each 10000 times of writing/reading.

Figure 8A:
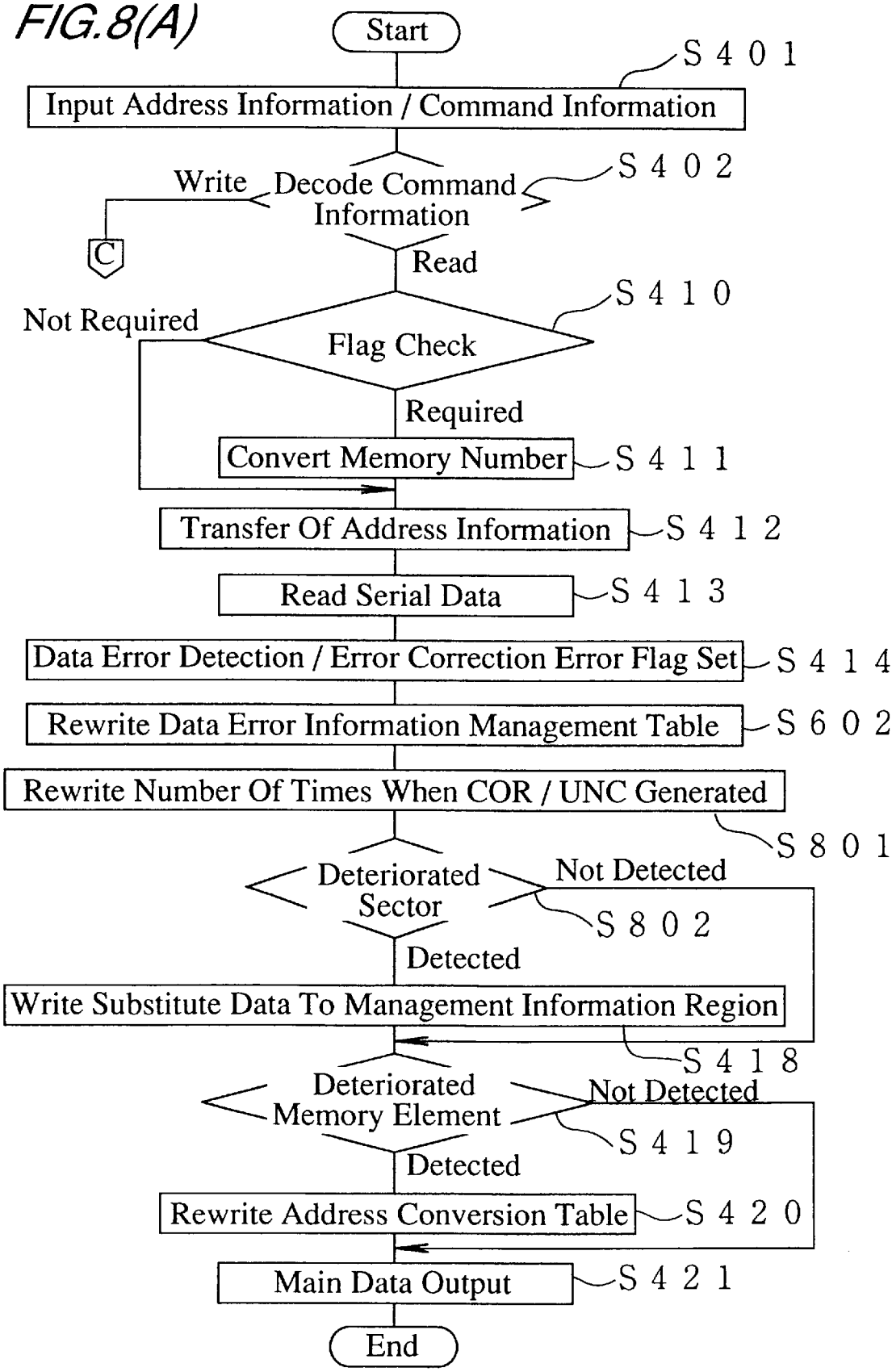
FIGS. 8(A and B) is a flow chart given in explanation of the operation of a semiconductor storage device according to a third embodiment.
Figure 8B:
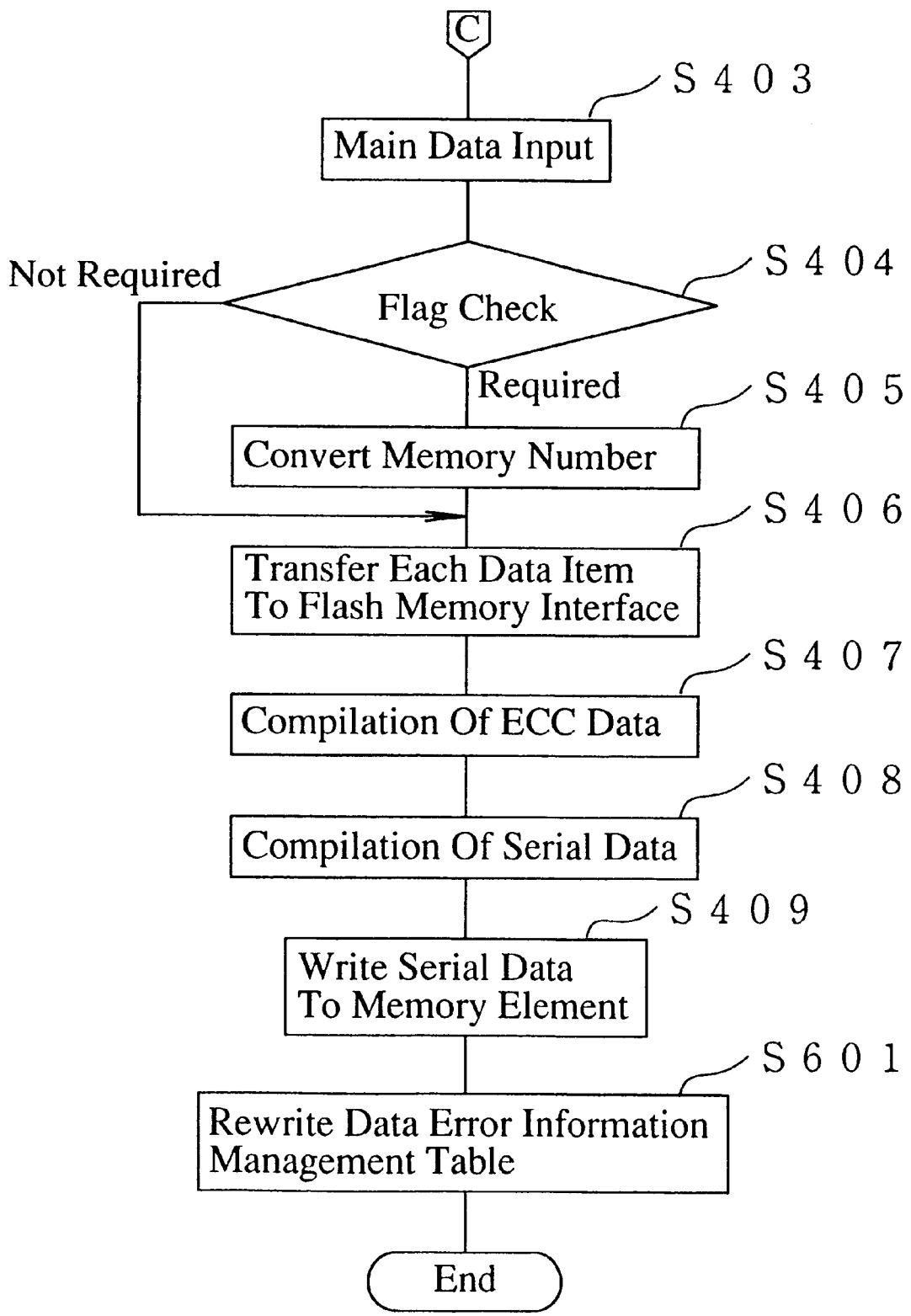

FIG. 8 is a flow chart given in explanation of the operation of a semiconductor disk device 100 according to this embodiment.

First of all, just as in the case of the embodiments described above (see FIG. 4 and FIG. 6), the command information and address information are input to micro CPU 131 (S401) through host interface 121 and micro CPU interface 122; this micro CPU 131 then decodes the content of the command information (S402).

Then, if this command information is a write command, micro CPU 131, just as in the embodiments described above, checks the main data input (S403) and degeneracy operation required/not required flag (S404); if the degeneracy operation required/not required flag is "required", it uses the address conversion table 128 to convert the memory number to a physical memory number (S405) and then sends the address information, command information and main data to the flash memory interface (S406). Then, ECC control section 126 compiles ECC data using the main data (S407), and flash memory interface 125 compiles serial data (see FIG. 14) (S408), and writes this serial data in the corresponding sector (if this sector is deteriorated, a prescribed substitute sector) corresponding to the aforementioned address information (S409).

Further, just as in the case of the second embodiment, after writing of the serial data has been completed, rewriting of "number of times of writing" of data error information management table 127 is performed (S601).

On the other hand, in step S402, if the command information is a read command, just as in the case of the first embodiment, micro CPU 131 checks the condition of the degeneracy operation required/not required flag (S410) and, if it is "required", converts the memory number to a physical memory number (S411), and sends the address information to flash memory interface 125 (S412). Then, flash memory interface 125 reads the serial data from the sector corresponding to the address information (if this is sector is deteriorated, the prescribed substitute sector) (S413) and data error detection and correction by ECC control section 126 and setting of the error flag by micro CPU 131 are performed (S414).

Next, under the control of micro CPU 131, rewriting of data error information management table 127 is performed (S602). In this rewriting, first of all, the "number of times of reading" of the sectors that were read are respectively incremented by "1". Then, rewriting of the "number of times of occurrence of COR" or "number of times of occurrence of UNC" of the sectors in respect of which an error was detected in the error check described above (S414) is performed (S801). As described above, in this rewriting, if the sum of the number of times of writing and the number of times of reading of the sector is 10000 times or less, the storage value of storage region $C_1$ is incremented by "1"; if it is 10001 times or more, but no more than 20000 times, the storage value of storage region $C_2$ is incremented by "1".

Then, in this embodiment, micro CPU 131 uses this data error information management table 127 to compare the number of times when COR occurred and the number of times when UNC occurred with a prescribed threshold value (hereinbelow called "threshold value for number of times when data error occurred") (S801). Sectors in respect of which at least one of the number of times when COR is generated or the number of times when UNC is generated exceeds the threshold value for the number of times when data error is generated are then deemed to be deteriorated (S802). Thereupon, if a deteriorated sector is detected, just as in the case of the first embodiment, information for use of a substitute sector in subsequent write operations is stored in management information region 1501 (see FIG. 15) (S418) and the total of deteriorated sectors in the memory element to which this deteriorated sector belongs is added up and compared with the sector number threshold value; in addition, if the total number of deteriorated sectors exceeds the sector number threshold value, the memory element is deemed to be deteriorated (S419), and the logical memory numbers of the address conversion table 128 are rewritten (S420).

After this, just as in the case of the first embodiment, the data in flash memory interface 125 (if there is correction by the ECC, the corrected data) is output through data buffer 123 and host interface 121 to outside the semiconductor disk device 100 (S421).

Thus, in this embodiment, the determination as to whether a sector is deteriorated or not is performed by means of the number of times when COR occurred and the number of times when UNC occurred. Consequently, in cases where memory elements M(0)~M(9) are employed that have a characteristic wherein the frequency of occurrence of data error increases steeply after the number of times of writing/reading has exceeded a certain number, the situation with regard to occurrence of deteriorated sectors can be accurately determined.

Also, it is the same as the first embodiment described above in that, using the address conversion table 128, it is possible to ensure that memory elements for which there is a large number of occurrences of deteriorated sectors are not used and in that it is possible to predict at an early stage the possibility of failure of the memory element as a whole or of failure of the semiconductor disk device as a whole.

It should be noted that, although, in this embodiment, the determination as to whether a sector was deteriorated was performed by establishing whether at least one of the number of times when COR occurred or the number of times when UNC occurred exceeded the threshold value for the number of times of occurrence of data error, other methods of determination could be adopted. For example, in making the determination of occurrence of deterioration, the threshold value of number of times when data error occurred could be altered with the number of times when COR occurred and the number of times when UNC occurred, or deterioration could be deemed to have occurred when both the number of times when COR occurred and the number of times when UNC occurred exceed the threshold value for the number of times when data error occurred.

Also, it could be arranged to determine sector deterioration by reference to the number of times of consecutive occurrence of such data errors, instead of the number of times of occurrence of COR or UNC. With such a method of determination, it is possible to determine accurately the condition of occurrence of deteriorated sectors when memory elements M(0)~M(9) are employed having a characteristic in which the frequency of occurrence of data errors rises abruptly after a fixed number of times of writing/reading is exceeded. Such a method of determination can be implemented by performing control (see FIG. 4) in practically the same way as in the case of the first embodiment, employing an arrangement in which instead of storing the number of times of occurrence of the data error information management table 127 (see FIG. 2) used in the first embodiment described above, the number of times of consecutive occurrence is stored.

Fourth Embodiment

Next, a semiconductor storage device and method of controlling it according to a fourth embodiment of the present invention are described, taking as example a semiconductor disk device using a flash memory.

A semiconductor disk device according to this embodiment differs from the first embodiment described above in that, when a memory element deteriorates, instead of using the sectors of the deteriorated memory element, substitute sectors of another memory element are employed.

The layout of semiconductor disk device 100 as a whole and the layout of data error information management table 127 are the same as in the first embodiment (see FIG. 1 and FIG. 2), so description thereof is omitted.

Figure 9:
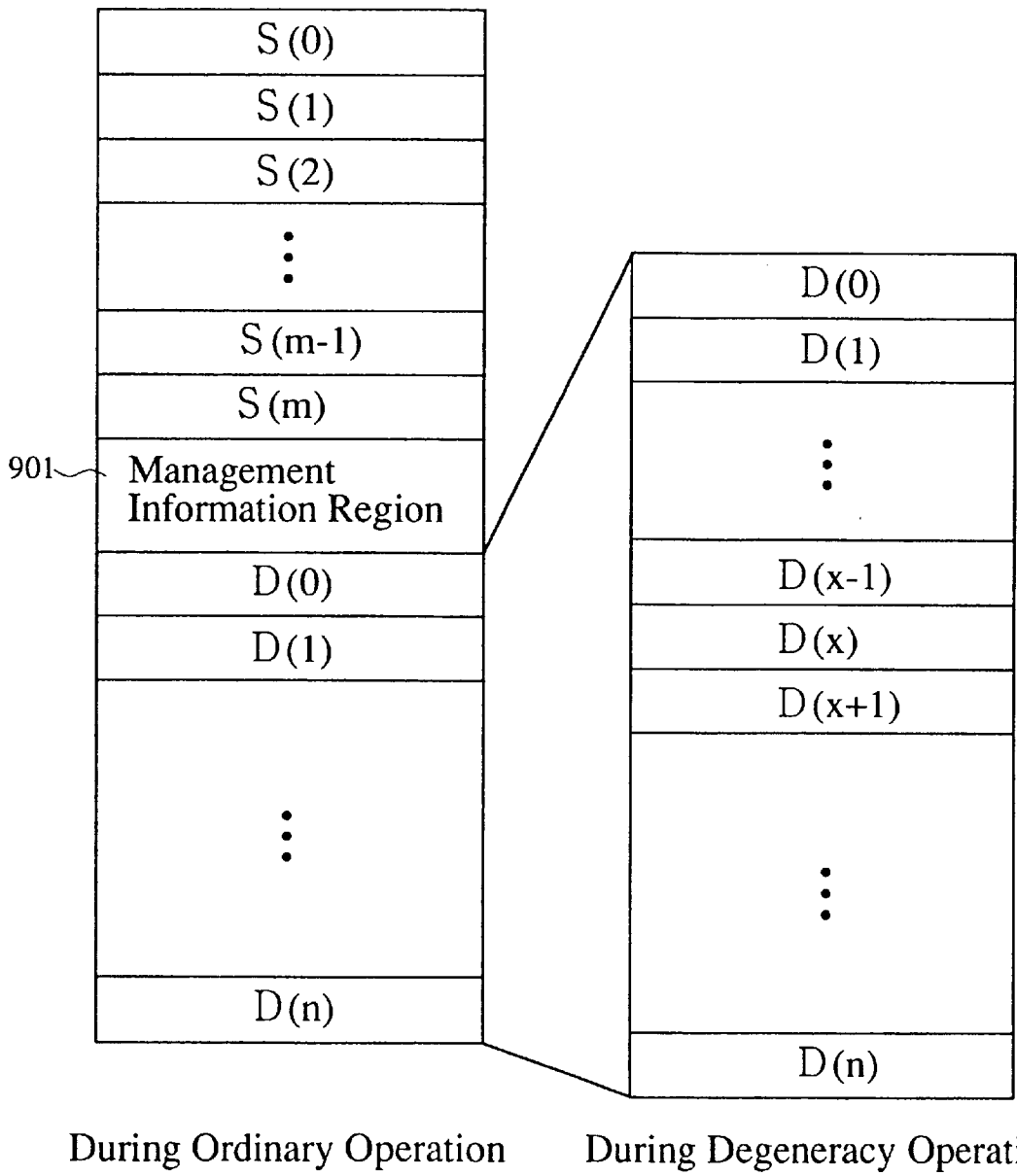
FIG. 9 is a diagram showing the sector layout of memory elements according to a fourth embodiment.

FIG. 9 is a diagram showing the sector layout within memory elements M(0)~M(9). As shown in FIG. 9(A), each memory element M(0)~M(9) comprises: m+1 sectors S(0)~S(m), n+1 substitute sectors D(0)~D(n), and a management information region 901. As will be described later, if there are no deteriorated memory elements, all the substitute sectors D(0)~D(n) of memory elements M(0)~M(9) are employed for substitution of sectors S(0)~S(m) provided within the memory element (see FIG. 9(A)). In contrast, if deteriorated memory elements are present (i.e. in the case of degeneracy operation), of substitute sectors D(0)~D(n) of the non-deteriorated memory elements, some are employed for substitution of these memory elements while the others are employed for substitution of the deteriorated memory elements (see FIG. 9(B)). In the example shown in FIG. 9(B), of the substitute sectors provided in a non-deteriorated memory element, x substitute sectors D(0)~D(x-1) are employed for substitution of that memory element, while the other substitute sectors D(x)~D(n) are employed for substitution of a deteriorated memory element. It should be noted that, in the management information region 901, only information concerning substitute sectors D(0)~D(x-1) that are employed for the substitution of deteriorated sectors generated within this memory element are stored; information of substitute sectors D(x)~D(n) that are used for the substitution of other deteriorated memory elements is not stored.

FIG. 10 is a diagram given in explanation of the principles of address conversion according to this embodiment. As shown in this Figure, in this address conversion table 128, when for example memory element M(j) i.e. a memory element whose physical memory number is "j" has become unused, a substitute sector from among the other memory elements M(0)~M(j-1), M(j+1)~M(9) is allocated. Specifically, in place of the sectors S(0)~S(g) provided within memory element M(j), the substitute sectors D(x)~D(x+g) of memory element M(0) are employed; in place of the sectors S(g+1)~S(2 g) provided within memory element (j), the substitute sectors D(x)~D(x+g) of memory element M(1) are employed; and subsequently in the same way, an arbitrary number of sectors in each case of the substitute sectors of memory elements M(2)~M(j-1), M(j+1)~M(9) are allocated. If the number of deteriorated memory elements increases, further allocation of the substitute sectors of the remaining memory elements is made.

Figure 11A:
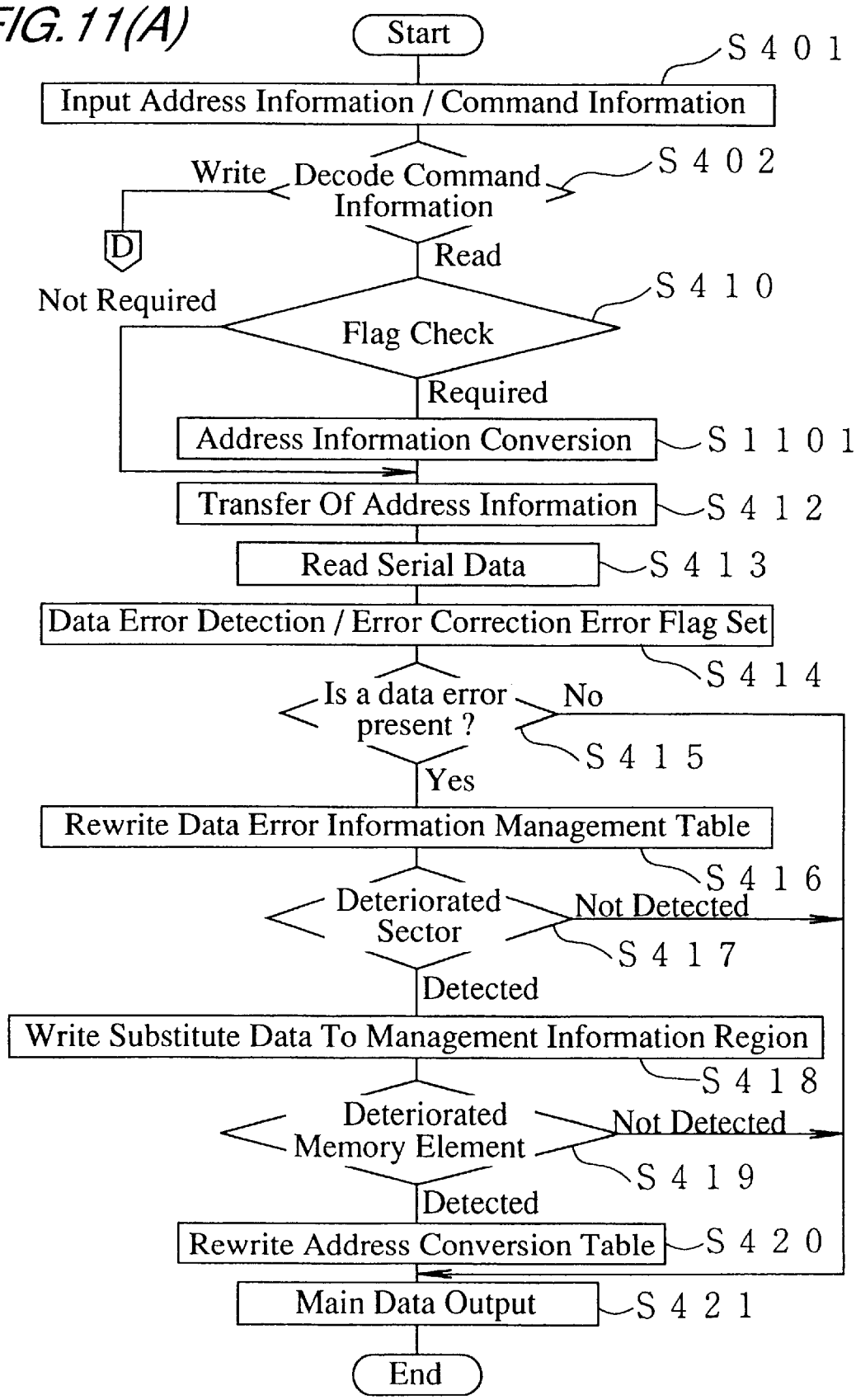
FIGS. 11(A and B) is a flow chart given in explanation of the operation of a semiconductor storage device according to a fourth embodiment.
Figure 11B:
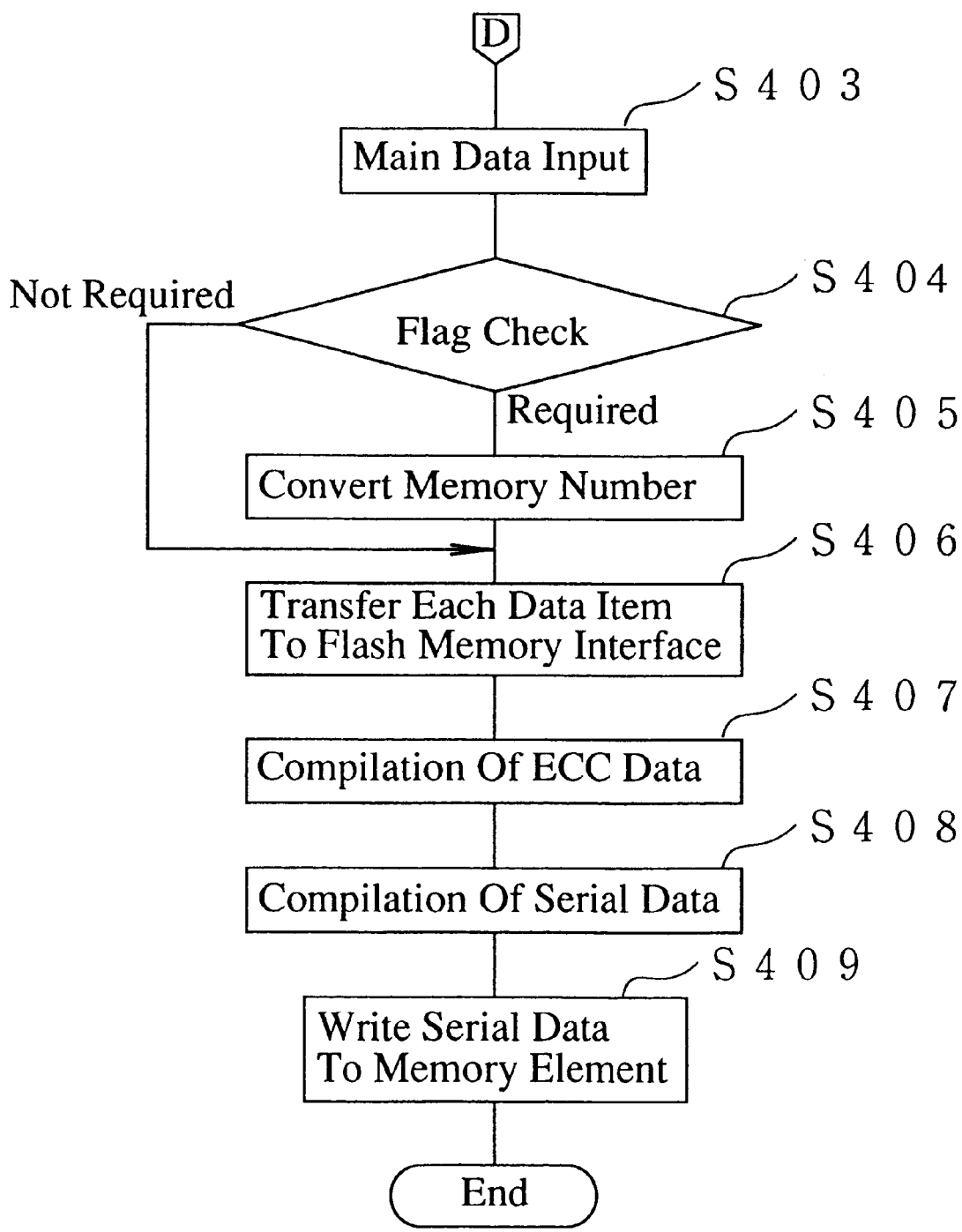
Figure 12:
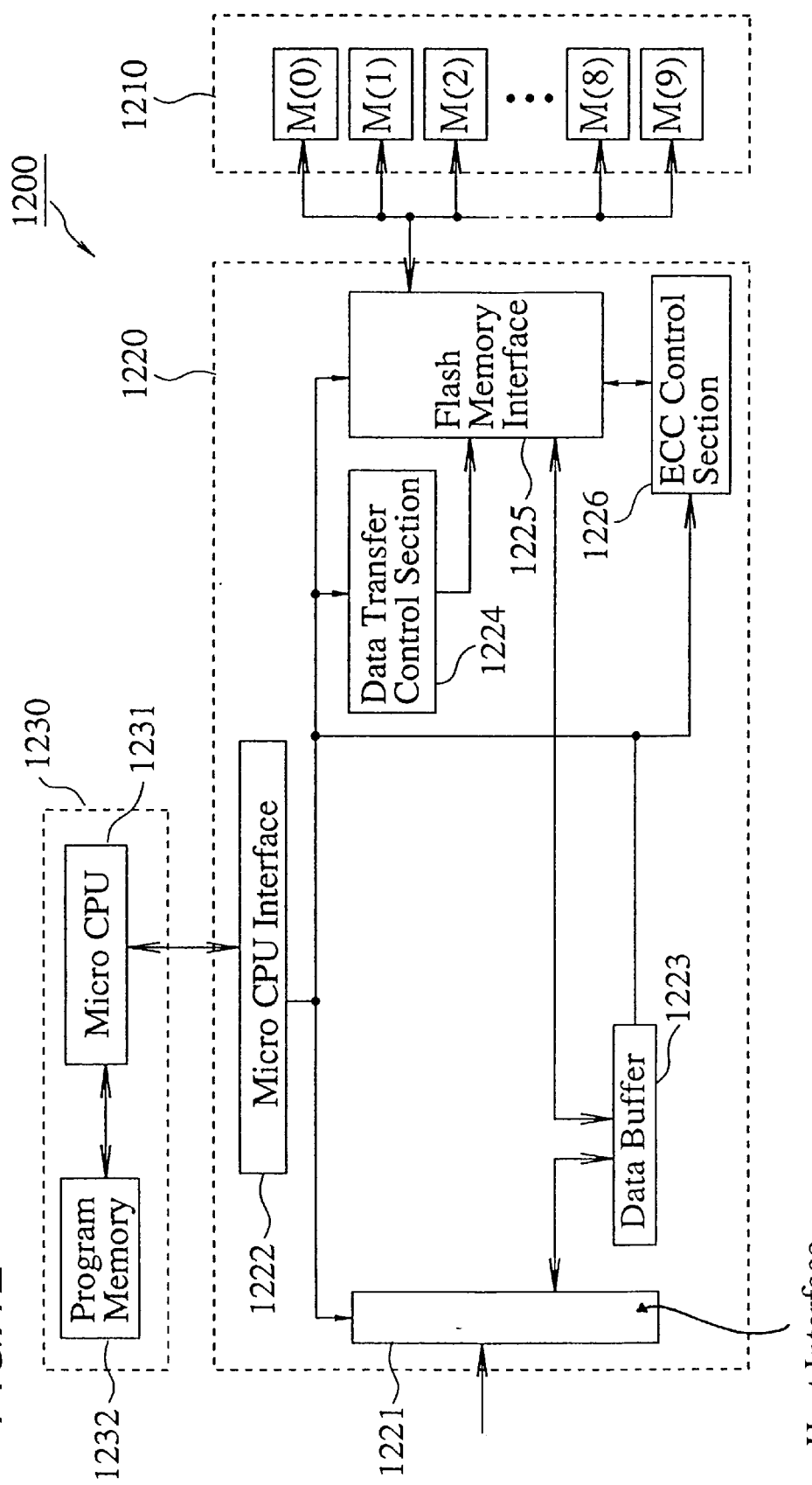
FIG. 12 is a block diagram showing schematically an example of the layout of a prior art semiconductor storage device.
Figure 13:
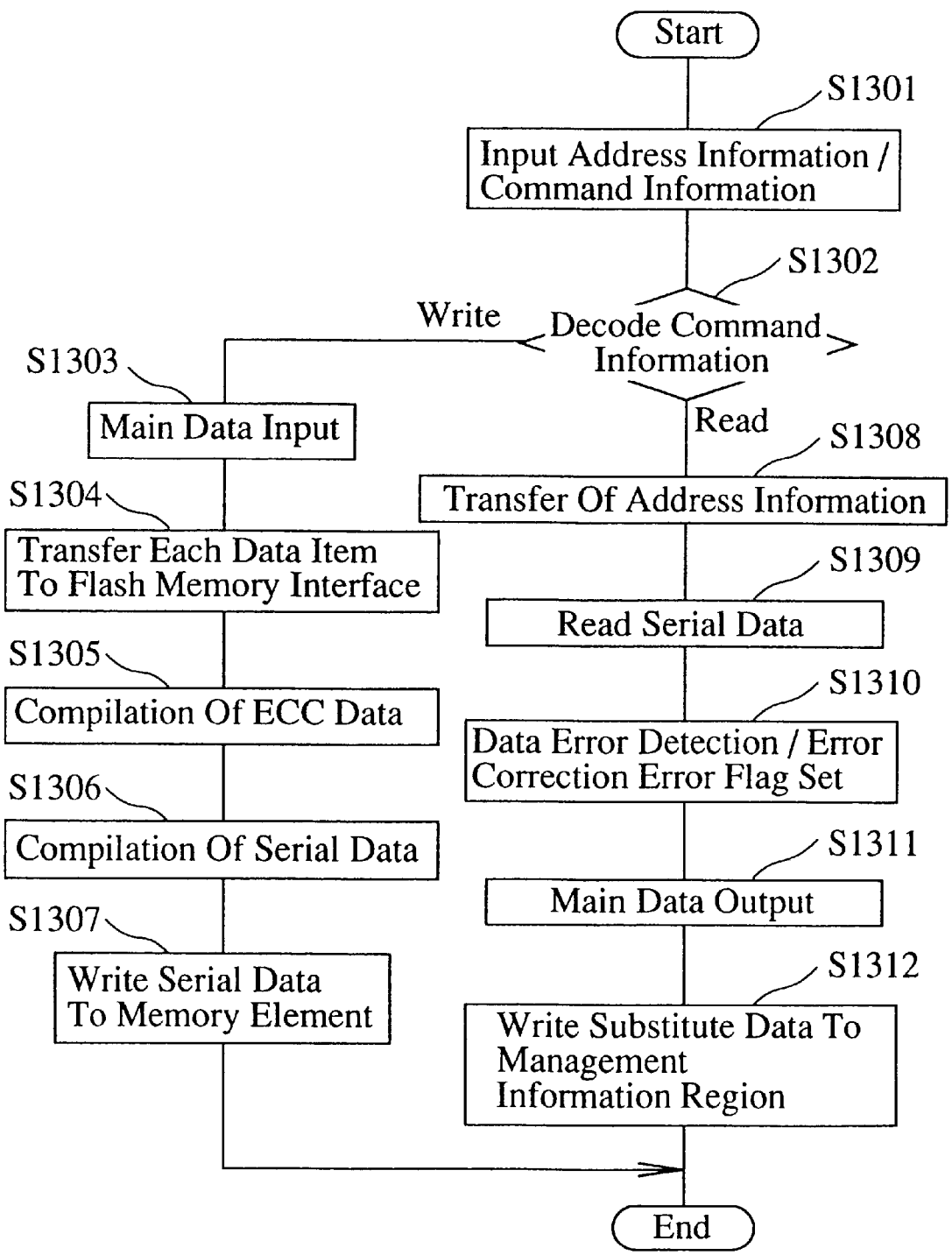
FIG. 13 is a flow chart given in explanation of the operation of a prior art semiconductor storage device.

FIG. 11 is a flow chart given in explanation of the operation of a semiconductor disk device 100 according to this embodiment.

First of all, just as in the case of the first embodiment (FIG. 4), command information and address information are input (S401) to micro CPU 131 through host interface 121 and micro CPU interface 122, and this micro CPU 131 decodes the content of the command information (S402).

Then, if this command information is a write command, micro CPU 131, just as in the case of the embodiments described above, performs input (S403) of main data and checking (S404) of the degeneracy operation required/not required flag; if the degeneracy operation required/not required flag is "required", using the address conversion table 128, it converts the memory number to a physical memory number (S405) and then sends the address information, command information and main data to the flash memory interface (S406). ECC control section 126 then compiles ECC data using the main data (S407) and flash memory interface 125 then compiles serial data (see FIG. 14) (S408), and writes this serial data (S409) to the sector corresponding to the address information described above (if this sector is deteriorated, to the prescribed substitute sector).

On the other hand, in step S402, if the command information is a read command, just as in the case of the first embodiment, micro CPU 131 checks the condition of the degeneracy operation required/not required flag (S410). Then, if this degeneracy required/not required flag is "required", it sends the address information referred to above to address conversion table 128, where address information conversion is performed as shown in FIG. 10 (S1101). Specifically, if, as shown in FIG. 10, the deteriorated memory element is assumed to be M(j), in the case of memory numbers "0"~"j-1" and "j+1"~"9" in the address information, the address information values before and after conversion are the same but, in the case of memory number "j" in the address information, by carrying out a process as shown in FIG. 10, the memory number and sector number are rewritten.

Next, the address information after conversion is sent to flash memory interface 125 (S412). After this, flash memory interface 125 reads serial data from the sector corresponding to the address information (if this sector is deteriorated, the prescribed substitute sector) (S413) and detection and correction of data errors are performed by ECC control section 126 and the error flag is set by micro CPU 131 (S414).

Next, it is determined by the error check described above (S414) whether or not data error has been detected (S415); if data error has been detected, just as in the case of the first embodiment, data error information management table 127 is rewritten (S416). Then, just as in the case of the first embodiment, a determination as to whether or not deterioration has occurred is made by comparing the number of times of occurrence of COR and the number of times of occurrence of UNC with the threshold value of number of times of occurrence of data error (S417); if a deteriorated sector is detected, the information of management information region 901 is rewritten (S418). Further, just as in the case of the first embodiment, it is determined whether or not the memory element to which this deteriorated sector belongs has deteriorated (S419); if the memory element has deteriorated, the information of address conversion table 128 is rewritten (S420).

Then, just as in the case of the first embodiment, the data in flash memory interface 125 (if there is correction by the ECC, the corrected data) is output to outside the semiconductor disk device 100 (S421) through data buffer 123 and host interface 121.

Thus, in this embodiment, if a deteriorated memory element is generated, storage of the serial data was effected using substitute sectors of other memory elements. Consequently, with this embodiment, the reduction in memory capacity of flash memory section 110 when deteriorated memory elements were generated can be minimised.

Furthermore, it is identical with the embodiments described above in that the situation regarding occurrence of deteriorated sectors can be accurately determined, in that, by using address conversion table 128, it can be arranged not to employ memory elements in which a large number of deteriorated sectors occur, and in that the probability of failure of a memory element as a whole or the probability of failure of the semiconductor disk device as a whole can be forecast at an early stage.

It should be noted that, while, in this embodiment, determination of sector deterioration was performed in the same way as in the first embodiment described above by comparing the number of times of occurrence of COR or UNC with the threshold value for the number of times of occurrence of data error, it would be possible to determine sector deterioration by comparing the probability of COR or UNC occurrence with a threshold value of probability of data error occurrence (i.e. the same method as in the case of the second embodiment), or by comparing the number of times when COR or UNC occurred with a threshold value for the number of times when data error occurred (i.e. the same method as in the case of the third embodiment).

Also, although, in the embodiments described above, determination of sector deterioration was effected by a method of a single type, it would be possible to combine a plurality of types of method of determination. For example, both determination using a threshold value of probability of data error occurrence and determination using a threshold value of number of times of data error occurrence could be performed, and a deteriorated sector could be determined when one or both of the data error occurrence probability or number of times of data error occurrence exceed a threshold value.

As described above, with the present invention, the reliability of a semiconductor storage device using memory elements in which deterioration is a problem can be raised and its life can be increased.

What is claimed is:

1. A semiconductor storage device comprising:

a storage section comprising a plurality of memory elements having a plurality of sectors that are used as ordinary sectors and spare sectors, wherein said memory elements are accessed in accordance with a first memory number indicated in a first address information;

an input section for inputting an externally received second address information which indicates a second memory number;

an address conversion table for storing conversion information which indicates a relationship between said first memory numbers and said second memory numbers, and for converting said second address information into said first address information by using said conversion information;

a control section for performing writing/reading of data to said memory elements in accordance with said first memory number indicated in said first address information obtained by said address conversion table;

a data error information management table for storing error data indicative of an occurrence of write/read errors of said memory elements; and a deterioration detection section for detecting a deterioration of said memory elements in accordance with said error data stored in said data error information management table, and for rewriting a first memory number of said address conversion table such that a memory element that is detected as being deteriorated by said deterioration detection section is not used.

2. The semiconductor storage device according to claim 1, wherein said data error information management table stores said error data based on a result of calculation of a prescribed calculation processing using at least one of correctable write/read errors or uncorrectable write/read errors.

3. The semiconductor storage device according to claim 2, wherein said data error information management table stores for each sector, as said error data, at least one of a the number of occurrences of correctable write/read errors or a number of occurrences of uncorrectable write/read errors.

4. The semiconductor storage device according to claim 2, wherein said data error information management table stores for each sector, as said error data, at least one of a number of occurrences of correctable write/read errors or a number of occurrences of uncorrectable write/read errors, and a number of write operations and a number of read operations.

5. The semiconductor storage device according to claim 2, wherein said data error information management table stores for each sector, as said error data, at least one of a number of occurrences of correctable write/read errors or a number of occurrences of uncorrectable write/read errors in each of a prescribed number of write/read operations.

6. The semiconductor storage device according to claim 2, wherein said data error information management table stores for each sector, as said error data, at least one of a number of consecutive occurrences of correctable write/read errors or a number of consecutive occurrences of uncorrectable write/read errors.

7. The semiconductor storage device according to claim 2, wherein said deterioration detection section deems a sector for which said result of calculation exceeds a first threshold value to be a deteriorated sector, and wherein said deterioration detection section deems a memory element for which a number of said deteriorated sectors exceeds a second threshold value to be a deteriorated memory element.

8. The semiconductor storage device according to claim 1, wherein, in the writing/reading of data after detection of a deteriorated memory element by said deterioration detection section, said address conversion table converts said address information such that said memory elements that are not specified as being deteriorated memory elements are specified by consecutive addresses.

9. The semiconductor storage device according to claim 1, wherein, in writing/reading of data after a deteriorated memory element has been detected by said deterioration detection section, said address conversion table converts said address information such that a spare sector in another memory element is employed instead of the respective sectors in said deteriorated memory elements.

10. The method of controlling a semiconductor storage device according to claim 1, wherein said memory elements are flash memories and said semiconductor storage device is a semiconductor disk device.

11. A method of controlling a semiconductor storage device, said method comprising:

storing error data indicative of an occurrence of write/read errors of a plurality of memory elements in a data error information management table, each of said memory elements having a plurality of sectors employed as ordinary sectors and as spare sectors, wherein said memory elements are accessed in accordance with a first memory number indicated in a first address information;

detecting a deterioration of said memory elements using a deterioration detection section in accordance with said error data stored in said data error information management table;

receiving an externally supplied second address information containing a second address number;

converting said second address information into said first address information by altering said second memory number into said first memory number by accessing an address conversion table which stores information indicating a relationship between said first memory numbers and said second memory numbers;

performing writing/reading of data to said memory elements in accordance with a first address number indicated in said first address information converted in said converting step; and rewriting said first memory number of said address conversion table such that a memory element that is detected to have deteriorated by said deterioration detection section is not used.

12. The method of controlling a semiconductor storage device according to claim 11, wherein said storing of error data includes performing a prescribed calculation processing using at least either correctable write/read errors or uncorrectable write/read errors and storing a result of the calculation processing in said data error information management table as said error data.

13. The method of controlling a semiconductor storage device according to claim 12, wherein said calculating processing includes calculating for each sector at least either a number of occurrences of correctable write/read errors or a number of occurrences of uncorrectable write/read errors.

14. The method of controlling a semiconductor storage device according to claim 12, wherein said calculation processing includes calculating for each sector at least either a number of occurrences of correctable write/read errors or a number of occurrences of uncorrectable write/read errors, as well as a number of write operations and a number of read operations.

15. The method of controlling a semiconductor storage device according to claim 12, wherein said calculation processing includes calculating, for each sector, at least either a number of correctable write/read errors or a number of uncorrectable write/read errors generated in each of a prescribed number of writing/reading operations.

16. The method of controlling a semiconductor storage device according to claim 12, wherein said said calculation processing includes calculating, for each sector, at least either a number of consecutive occurrences of correctable write/read errors or a number of occurrences of uncorrectable write/read errors.

17. The method of controlling a semiconductor storage device according to claim 12, wherein said detecting a deterioration of said memory elements includes detecting a sector for which said result of the calculation processing exceeds a first threshold value to be a deteriorated sector and deems a memory element whose number of deteriorated sectors exceeds a second threshold value to be a deteriorated memory element.

18. The method of controlling a semiconductor storage device according to claim 11, wherein said said second address information is converted by said address conversion table such that, in subsequent data writing/reading operations, when a deteriorated memory element is detected by said deterioration detection section, said memory elements which are not specified as being deteriorated memory elements and in which deterioration is not detected are specified by consecutive addresses.

19. The method of controlling a semiconductor storage device according to claim 11, wherein said said second address information is converted by said address conversion table such that, in subsequent data writing/reading operations, when a deteriorated memory element is detected by said deterioration detection section, spare sectors in another memory element are employed instead of the respective sectors in the deteriorated memory element.

20. The method of controlling a semiconductor storage device according to claim 11, wherein said memory elements are flash memories and said semiconductor storage device is a semiconductor disk device.

\* \* \* \* \*